(12) United States Patent
Manassen et al.

(10) Patent No.: US 8,582,114 B2
(45) Date of Patent: Nov. 12, 2013

(54) OVERLAY METROLOGY BY PUPIL PHASE ANALYSIS

(75) Inventors: Amnon Manassen, Haifa (IL); Daniel Kandel, Aseret (IL); Moshe Baruch, D.N. Misgav (IL); Vladimir Levinski, Nazareth Ilit (IL); Noam Sapiens, Bat Yam (IL); Joel Seligson, D.N. Misgav (IL); Andy Hill, Sunnyvale, CA (US); Ohad Bachar, Timrat (IL); Daria Negri, Nesher (IL); Ofer Zaharan, Jerusalem (IL)

(73) Assignee: KLA-Tencor Corporation, Milpitas, CA (US)

( * ) Notice: Subject to any disclaimer, the term of this patent is extended or adjusted under 35 U.S.C. 154(b) by 151 days.

(21) Appl. No.: 13/209,778

(22) Filed: Aug. 15, 2011

(65) Prior Publication Data
US 2013/0044331 A1    Feb. 21, 2013

(51) Int. Cl.
*G01B 11/02*    (2006.01)

(52) U.S. Cl.
USPC .......................................... 356/509

(58) Field of Classification Search
USPC .................. 356/399–401, 508–510
See application file for complete search history.

(56) References Cited

U.S. PATENT DOCUMENTS

| | | | |
|---|---|---|---|
| 6,628,390 B1* | 9/2003 | Johnson | 356/400 |
| 7,368,206 B2 | 5/2008 | Fay et al. | |
| 2004/0233442 A1* | 11/2004 | Mieher et al. | 356/401 |
| 2007/0064232 A1 | 3/2007 | Yang et al. | |
| 2008/0074665 A1* | 3/2008 | Brill et al. | 356/399 |
| 2009/0262362 A1* | 10/2009 | de Groot et al. | 356/508 |
| 2010/0328655 A1* | 12/2010 | Den Boef | 356/237.5 |
| 2011/0007314 A1 | 1/2011 | Den Boef et al. | |
| 2011/0080585 A1 | 4/2011 | Rabello et al. | |
| 2013/0010306 A1* | 1/2013 | Coene et al. | 356/508 |

* cited by examiner

*Primary Examiner* — Gregory J Toatley
*Assistant Examiner* — Dominic J Bologna
(74) *Attorney, Agent, or Firm* — Suiter Swantz pc llo

(57) ABSTRACT

The present invention may include measuring a first phase distribution across a pupil plane of a portion of illumination reflected from a first overlay target of a semiconductor wafer, wherein the first overlay target is fabricated to have a first intentional overlay, measuring a second phase distribution across the pupil plane of a portion of illumination reflected from a second overlay target, wherein the second overlay target is fabricated to have a second intentional overlay in a direction opposite to and having the same magnitude as the first intentional overlay, determining a first phase tilt associated with a sum of the first and second phase distributions, determining a second phase tilt associated with a difference between the first and second phase distributions, calibrating a set of phase tilt data, and determining a test overlay value associated with the first and second overlay target.

23 Claims, 9 Drawing Sheets

OVERLAY METROLOGY BY PUPIL PHASE ANALYSIS

TECHNICAL FIELD

The present invention generally relates to a method and system for providing phase based metrology of two or more overlay targets of a semiconductor wafer.

BACKGROUND

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etching, deposition, and ion implantation. Multiple semiconductor devices may be fabricated in an arrangement on a single semiconductor wafer and then separated into individual semiconductor devices.

Metrology processes are used at various steps during a semiconductor manufacturing process to monitor and control one or more semiconductor layer processes. For example, metrology processes are used to measure one or more characteristics of a wafer such as dimension (e.g., line width, thickness, etc.) of features formed on the wafer during a process step, wherein the quality of the process step can be determined by measuring the one or more characteristics. One such characteristic includes overlay error. An overlay measurement generally specifies how accurately a first patterned layer aligns with respect to a second patterned layer disposed above or below it or how accurately a first pattern aligns with respect to a second pattern disposed on the same layer. Overlay error is traditionally determined with an overlay target having structures formed on one or more layers of a work piece (e.g., semiconductor wafer). The structures may take the form of gratings, and these gratings may be periodic. If the two layers or patterns are properly formed, then the structure on one layer or pattern tends to be aligned relative to the structure on the other layer or pattern. If the two layers or patterns are not properly formed, then the structure on one layer or pattern tends to be offset or misaligned relative to the structure on the other layer or pattern. Overlay error is the misalignment between any of the patterns used at different stages of semiconductor integrated circuit manufacturing.

Conventionally, overlay metrology is carried out utilizing an intensity based optical system. In this setting, an intensity detector, such as a CCD based detector, is used to image two or more patterns of a target in order to measure the misalignment between the two or more patterns.

In addition to intensity information, the illumination reflected from the surface of a given set of overlay targets of a semiconductor wafer also includes phase information. It is, therefore, desirable to provide a method and system suitable for measuring overlay error utilizing phase information from two or more targets of a semiconductor wafer.

SUMMARY

A method for measuring overlay utilizing pupil phase information is disclosed. In one aspect, a method may include, but is not limited to, measuring a first phase distribution across a pupil plane of a portion of illumination reflected from a first overlay target of a semiconductor wafer, wherein the first overlay target is fabricated to have a first intentional overlay; measuring a second phase distribution across the pupil plane of a portion of illumination reflected from a second overlay target of the semiconductor wafer, wherein the second overlay target is fabricated to have a second intentional overlay, wherein the second intentional overlay is along a direction opposite to the first intentional overlay, wherein the first intentional overlay and the second intentional overlay have substantially the same magnitude; determining a first phase tilt associated with a sum of the first phase distribution and the second phase distribution; determining a second phase tilt associated with a difference between the first phase distribution and the second phase distribution; calibrating a set of phase tilt data utilizing the determined second phase tilt and the magnitude of the first and second intentional overlay; determining a test overlay value associated with the first overlay target and the second overlay target by comparing the first phase tilt to the calibrated set of phase tilt data.

In another aspect, a method may include, but is not limited to, measuring a first phase distribution across a pupil plane of a portion of illumination reflected from a first overlay target of a semiconductor wafer, wherein the first overlay target is fabricated to have a first intentional overlay; having a selected magnitude along a selected direction; measuring a second phase distribution across the pupil plane of a portion of illumination reflected from a second overlay target of the semiconductor wafer, wherein the second overlay target is fabricated to have a second intentional overlay, wherein the second intentional overlay is along a direction opposite to the first intentional overlay, wherein the first intentional overlay and the second intentional overlay have substantially the same magnitude; measuring a third phase distribution across the pupil plane of a portion of illumination reflected from a third overlay target of the semiconductor wafer, wherein the third overlay target is fabricated to have zero intentional overlay; determining a first phase tilt associated with a sum of the first phase distribution and the second phase distribution; determining at least one of a second phase tilt or a third phase tilt, wherein the second phase tilt is associated with a difference between the first phase distribution and the third phase distribution and the third phase tilt is associated with a difference between the third phase distribution and the second phase distribution; calibrating a set of phase tilt data utilizing at least one of the second phase tilt or the third phase tilt and the magnitude of the first intentional overlay and the second intentional overlay; and determining one or more test overlay values associated with the first overlay target, the second overlay target, and the third overlay target by comparing the first phase tilt to the calibrated set of phase tilt data.

A system for measuring overlay utilizing pupil phase information is disclosed. In one aspect, a system may include, but is not limited to, a phase based metrology system configured to: measure a first phase distribution across a pupil plane of a portion of illumination reflected from a first overlay target of a semiconductor wafer, wherein the first overlay target is fabricated to have a first intentional overlay; and measure a second phase distribution across the pupil plane of a portion of illumination reflected from a second overlay target of the semiconductor wafer, wherein the second overlay target is fabricated to have a second intentional overlay, wherein the second intentional overlay is along a direction opposite to the first intentional overlay, wherein the first intentional overlay and the second intentional overlay have substantially the same magnitude; and one or more computer systems configured to: determine a first phase tilt associated with a sum of the first phase distribution and the second phase distribution; determine a second phase tilt associated with a difference between the first phase distribution and the second phase distribution; and calibrate a set of phase tilt data utilizing the determined second phase tilt; and determine a test overlay value associated with the first overlay target and the second overlay target utilizing by comparing the first phase tilt to the calibrated set of phase tilt data.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Reference will now be made in detail to the subject matter disclosed, which is illustrated in the accompanying drawings.

Referring generally to FIGS. 1A through 9, a system and method for measuring overlay between two or more process layers utilizing pupil phase information is described in accordance with the present disclosure. The present invention is directed at a method and system suitable for carrying out phase based overlay metrology utilizing two or more overlay targets engineered to have a selected amount of intentional overlay. In this regard, the various embodiments of the present invention may act to quantify the phase distribution along one or more directions of the pupil plane of an overlay metrology system and in turn determine an associated 'phase tilt' of the illumination reflected from two or more intentionally offset overlay targets. Utilizing the measured phase tilt information, the embodiments of the present invention may then determine a 'test' overlay (i.e., the unintentional overlay error) for the measured overlay targets of the semiconductor wafer.

Figure 1A:
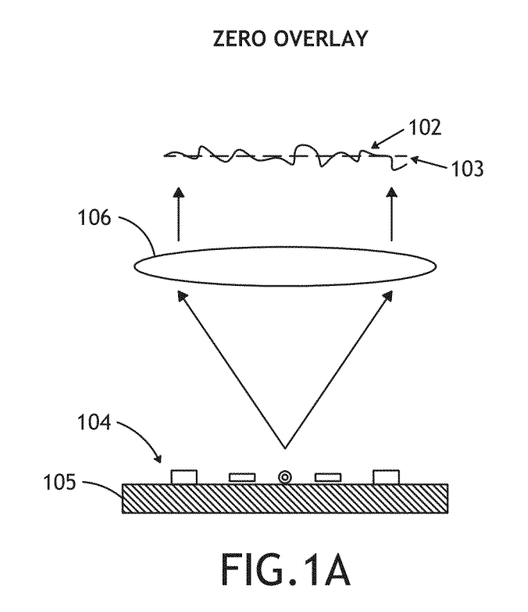
FIG. 1A illustrates a conceptual view of a pupil phase distribution resulting from zero overlay, in accordance with the present invention.
Figure 1B:
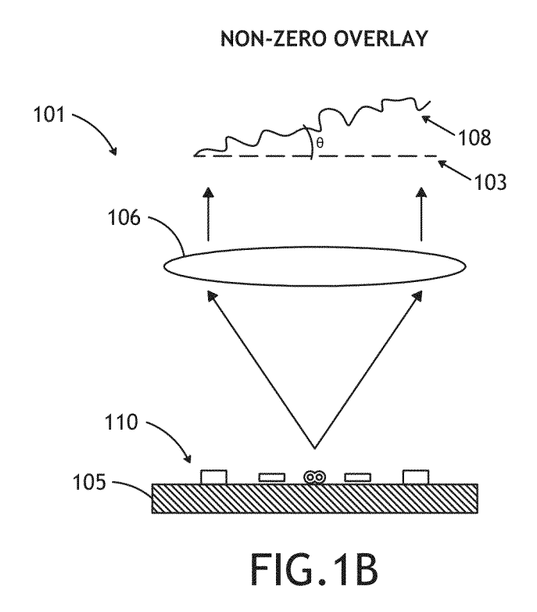
FIG. 1B illustrates a conceptual view of a pupil phase distribution resulting from non-zero overlay, in accordance with the present invention.

FIGS. 1A and 1B illustrate a conceptual view of overlay induced phase tilt along one or more directions of a pupil plane of an optical system. As shown in FIG. 1A, an overlay target 104 of a semiconductor wafer 105 having no measurable overlay error displays a roughly 'flat' pupil phase distribution 102 (e.g., pupil phase image) as a function of position along a selected direction of the pupil 103 of the imaging pathway of an optical metrology system. In contrast, an overlay target 110 having non-zero overlay produces a pupil phase distribution 108 having a 'phase tilt,' which is a function of position along a selected direction of the pupil 103 of the imaging pathway of an optical metrology system. In this regard the phase value of the pupil phase distribution 108 increases or decreases approximately linearly as a function of position along a selected direction (e.g., X-direction or Y-direction). Further, due to the complexity of a given phase distribution (e.g., 102 or 108), the pupil phase tilts measured using overlay targets may be calibrated utilizing overlay targets having an introduced 'intentional' overlay, as will be discussed in greater detail further herein. It is further noted that the angle of the pupil phase tilt may be approximately related to overlay of a given set of overlay targets by:

$$\tan\theta \approx \frac{OVL}{H_{eff}} \quad \text{(Eq. 1)}$$

where $\theta$ characterizes the slope of the pupil phase change with respect to position along a selected direction of the pupil, OVL represents the overlay associated with the measured overlay targets, and $H_{eff}$ represents the effective height of the overlay targets. As such, it is recognized that decreased thicknesses in overlay targets improves measurement sensitivity, as decreased target thickness increases phase tilt angle. Moreover, it is anticipated that the above described phase tilt effect is not dependent on pupil plane direction. In this sense, the measured phase tilt along the X-direction is independent of the measured phase title along the Y-direction.

Figure 2A:
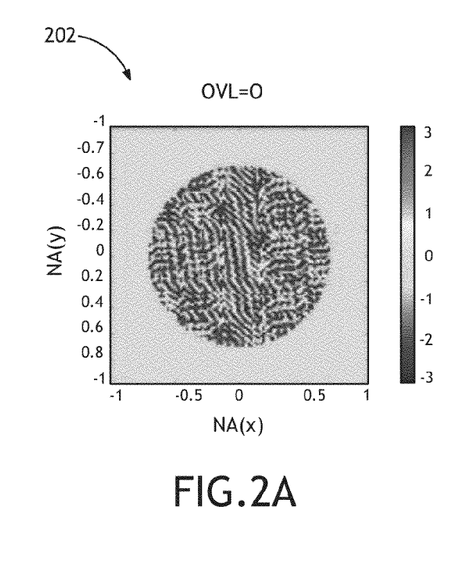
FIG. 2A illustrates a two-dimensional pupil phase image for a set of overlay targets having zero overlay, in accordance with the present invention.
Figure 2B:
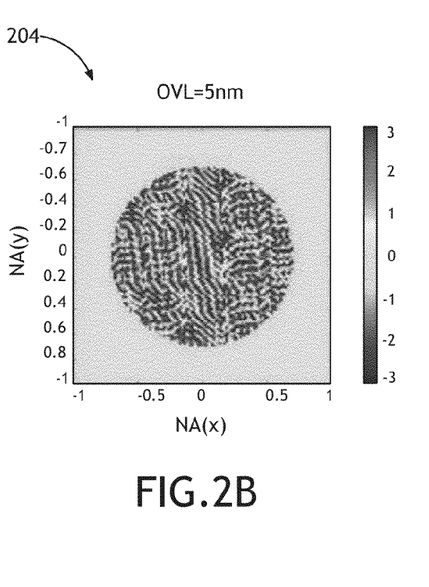
FIG. 2B illustrates a two-dimensional pupil phase image for a set of overlay targets having 2 nm overlay, in accordance with the present invention.
Figure 2C:
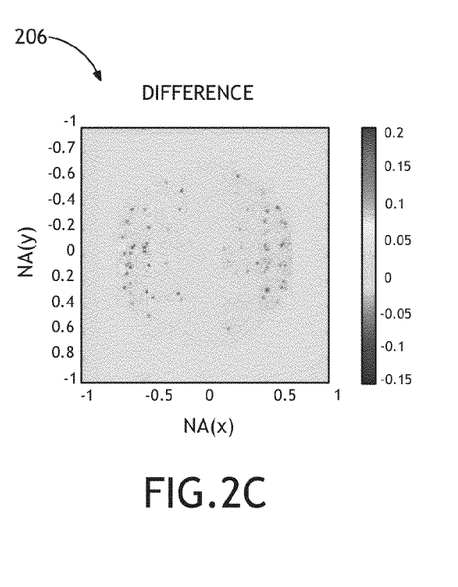
FIG. 2C illustrates a two-dimensional pupil phase difference image, in accordance with the present invention.

FIGS. 2A through 2B illustrates a series 200 of simulated X-phase two-dimensional phase image data sets mapped as a function of numerical aperture along the X- and Y-directions for various overlay values. FIG. 2A illustrates a set of phase image data 202 taken at a zero overlay value. FIG. 2B illustrates a set of phase image data 204 taken at an overlay value of 5 nm. FIG. 2C illustrates a difference function 206 calculated by subtracting the phase image 204 from phase image 202. As shown in FIG. 2B, it is difficult to discern a noticeable change in the phase image as a function of NA(X). Upon subtracting the images, however, as in difference image 206, it is clear that there exists a noticeable increase in phase change magnitude in either the positive or negative X-direction from NA(X)=0. By spatially averaging the phase change of phase difference image 206, a phase change across the collection pupil may be calculated.

It has further been found that the magnitude of the phase change observed in illumination from a set of overlay targets is a linear function of the overlay present in the measured overlay targets. The linear relationship between pupil phase tilt and overlay allows for straightforward calibration of phase tilt versus overlay data, as will be discussed in greater detail further herein.

As used throughout the present disclosure, the term "wafer" generally refers to a substrate formed of a semiconductor or non-semiconductor material. For example, a semiconductor or non-semiconductor material may include, but is not limited to, monocrystalline silicon, gallium arsenide, and indium phosphide. A wafer may include one or more layers. For instance, such layers may include, but are not limited to, a resist, a dielectric material, a conductive material, and a semiconductive material. Many different types of such layers are known in the art, and the term wafer as used herein is intended to encompass a wafer on which all types of such layers may be formed.

A typical semiconductor process includes wafer processing by lot. As used herein a "lot" is a group of wafers (e.g., group of 25 wafers) which are processed together. Each wafer in the lot is comprised of many exposure fields from the lithography processing tools (e.g. steppers, scanners, etc.). Within each field may exist multiple die. A die is the functional unit which eventually becomes a single chip. On product wafers, overlay metrology targets are typically placed in the scribeline area (for example in the 4 corners of the field). This is a region that is typically free of circuitry around the perimeter of the exposure field (and outside the die). In some instances, overlay targets are placed in the streets, which are regions between the die but not at the perimeter of the field. It is fairly rare for overlay targets to be placed on product wafers within the prime die areas, as this area is critically needed for circuitry.

One or more layers formed on a wafer may be patterned or unpatterned. For example, a wafer may include a plurality of dies, each having repeatable patterned features. Formation and processing of such layers of material may ultimately result in completed devices. Many different types of devices may be formed on a wafer, and the term wafer as used herein is intended to encompass a wafer on which any type of device known in the art is being fabricated.

Figure 3:
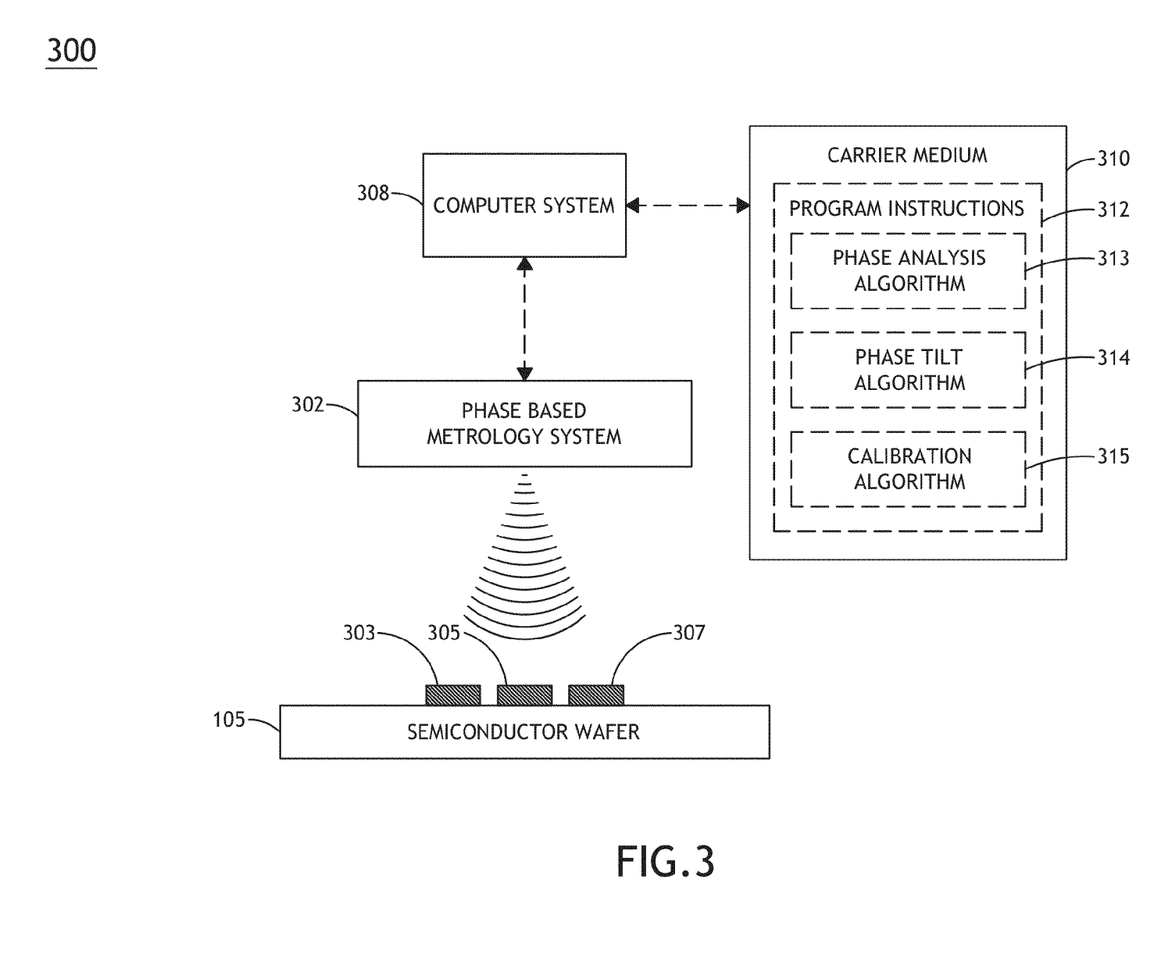
FIG. 3 is a block diagram illustrating a system for measuring overlay utilizing pupil phase information, in accordance with one embodiment of the present invention.

FIG. 3 illustrates a system 300 for measuring overlay utilizing pupil phase analysis, in accordance with the present invention. The system 300 may include a phased based metrology system 302 configured to perform overlay metrology at identified locations of the semiconductor wafer 105 via pupil phase analysis of two or more metrology targets (e.g., 303 and 305). In a further embodiment, the metrology system 302 may be configured to accept instructions from another subsystem of the system 300 in order to carry out a designated phase based metrology plan. For instance, the metrology system 302 may accept instructions from one or more computer systems 308 of the system 300. Upon receiving the instructions from the computer system 308, the metrology system 302 may perform phase based overlay metrology at various locations of the semiconductor wafer 105 identified in the provided instructions. The particular aspects of the various embodiments of the phase analysis and phase tilt analysis of the present invention are discussed in greater detail further herein.

In one embodiment, the one or more computer systems 308 may be configured to receive a set of measurements performed by the phase based metrology system 302 in a sampling process of one or more wafers of a lot. Upon receiving results of the one or more sampling process from the phase based metrology system 302, the one or more computer systems 308 may then calculate one or more overlay values associated with the sampled overlay targets via a preprogrammed overlay determination algorithm, which is configured to determine a measured overlay value through the determination and comparison of phase tilt associated with two or more overlay targets.

It should be recognized that the various steps described throughout the present disclosure may be carried out by a single computer system 308 or, alternatively, a multiple computer system 308. Moreover, different subsystems of the system 300, such as the metrology system 302, may include a computer system suitable for carrying out at least a portion of the steps described above. Therefore, the above description should not be interpreted as a limitation on the present invention but merely an illustration. Further, the one or more computer systems 308 may be configured to perform any other step(s) of any of the method embodiments described herein.

In another embodiment, the computer system 308 may be communicatively coupled to the phase based metrology system 302 or a process tool in any manner known in the art. For example, the one or more computer systems 308 may be coupled to a computer system of the phase based metrology system 302 or to a computer system of a process tool. In another example, the phase based metrology system 302 and a process tool may be controlled by a single computer system. In this manner, the computer system 308 of the system 300 may be coupled to a single metrology-process tool computer system. Moreover, the computer system 308 of the system 300 may be configured to receive and/or acquire data or information from other systems (e.g., inspection results from an inspection system, metrology results from an additional metrology system, or process tool correctables calculated from a system, such as KLA-Tencor's KT Analyzer) by a transmission medium that may include wireline and/or wireless portions. In this manner, the transmission medium may serve as a data link between the computer system 308 and other subsystems of the system 300. Moreover, the computer system 308 may send data to external systems via a transmission medium. For instance, the computer system 308 may send calculated process tool correctables to a separate metrology system, which exists independently of the described system 300.

The computer system 308 may include, but is not limited to, a personal computer system, mainframe computer system, workstation, image computer, parallel processor, or any other device known in the art. In general, the term "computer system" may be broadly defined to encompass any device having one or more processors, which execute instructions from a memory medium.

Program instructions 312 implementing methods such as those described herein may be transmitted over or stored on carrier medium 310. The carrier medium may be a transmission medium such as a wire, cable, or wireless transmission link. The carrier medium may also include a storage medium such as a read-only memory, a random access memory, a magnetic or optical disk, or a magnetic tape.

The embodiments of the system 300 illustrated in FIG. 3 may be further configured as described herein. In addition, the system 300 may be configured to perform any other step(s) of any of the method embodiment(s) described herein.

Figure 4:
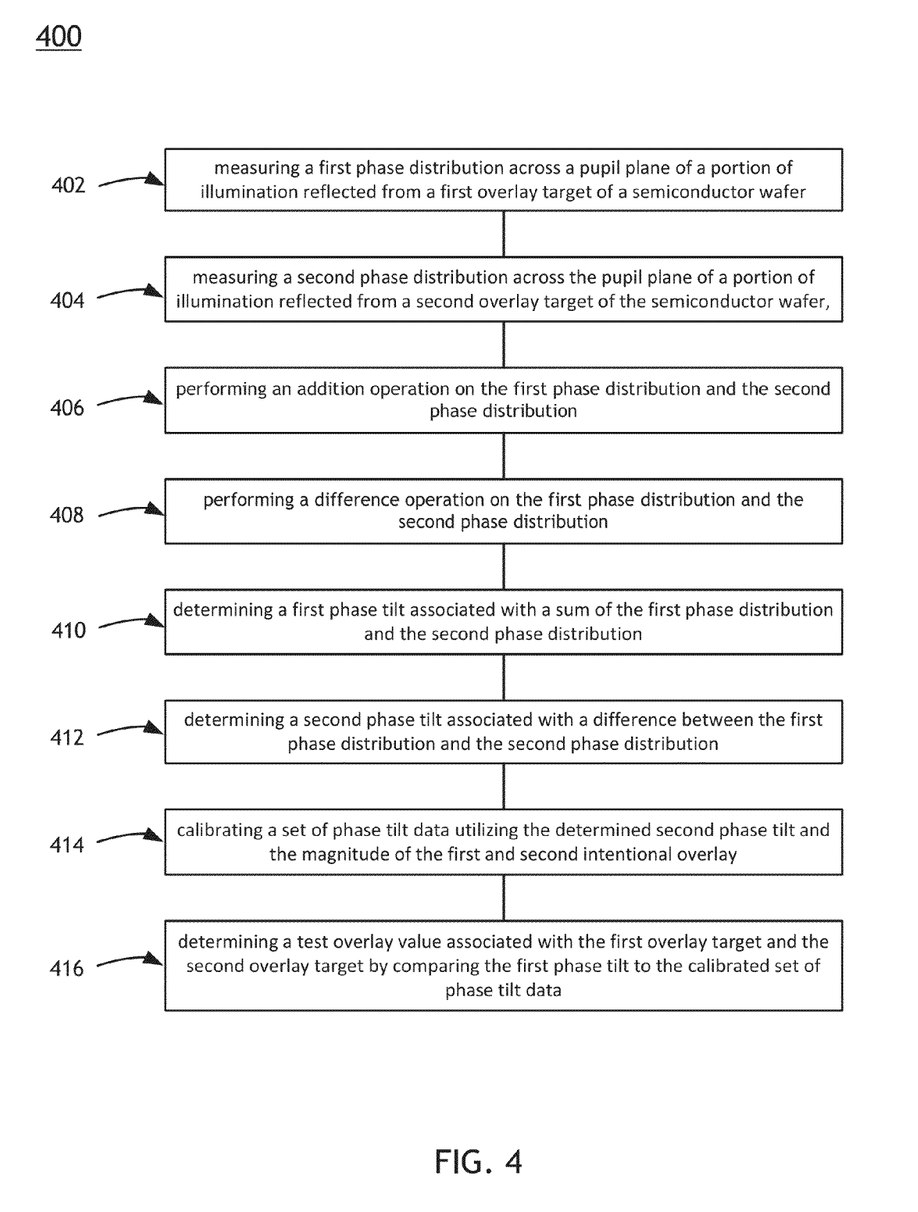
FIG. 4 is a flow diagram illustrating a method for measuring overlay utilizing pupil phase information, in accordance with one embodiment of the present invention.

FIG. 4 illustrates a process flow 400 suitable for implementation by the system 300 of the present invention. In one aspect, it is recognized that data processing steps of the process flow 400 may be carried out via a pre-programmed algorithm executed by one or more processors of computer system 308. In step 402, the phase based metrology system 302 of system 300 may measure a phase distribution (e.g., two-dimensional phase image) of illumination reflected from a first target 303 of the semiconductor wafer 105, wherein the first target 303 is fabricated to include a known or intentional overlay. In this sense, it should be recognized that a measurable overlay value associated with the first target 303 includes two components, namely 'intentional' overlay and 'test' overlay. The measured overlay is represented by:

$$OVL_M = OVL_T + OVL_I \quad (Eq. 2)$$

where $OVL_M$ represents the overlay measured by the phase based metrology system 302, $OVL_I$ represents the overlay displacement intentionally introduced into the tested overlay targets 303 and 305, and $OVL_T$ represents the test overlay representative of the unintentional mis-registration between measured patterns of the targets 303 and 305. In step 404, the phase based metrology system 302 may measure a phase distribution of illumination reflected from a second target 305. In contrast to the first target 303, the second target is fabricated to have an overlay which has the same magnitude but opposite displacement direction of the intentional overlay of step 402. As such, the measured overlay of the second target 305 may be expressed as:

$$OVL_M = OVL_T - OVL_I \quad (Eq. 3)$$

wherein the negative sign in Eq. 2 represents that the intentional overlay of Eq. 2, while of the same magnitude of the intentional overlay of Eq. 1 is in the opposite direction. Further, as will be discussed in greater detail further herein, the phase based metrology system 302 may consist of a modified two-beam interferometric arrangement or an optical system equipped with one or more wave-front sensors positioned at the pupil plane of an imaging pathway of the metrology system 302.

In step 406, the system 300 may calculate a sum of the first phase distribution and the second phase distribution. In step 408, the system 300 may calculate a difference between the first phase distribution and the second phase distribution. Throughout the present disclosure the sum and difference between the first phase distribution and the second phase distribution may be referred to as $Sum^{1,2}$ and $Diff^{1,2}$ respectively. In this sense the $Sum^{1,2}$ and $Diff^{1,2}$ functions may be written as:

$$Sum^{1,2} = \phi_1 + \phi_2 \quad (Eq. 4)$$

$$Diff^{1,2} = \phi_1 - \phi_2 \quad (Eq. 5)$$

wherein $\phi_1$ and $\phi_2$ represent the first and second phase distributions respectively. In one embodiment, the system 300 may perform the sum and difference operations of steps 406 and 408 utilizing a pre-programmed algorithm executed by one or more processors of the one or more computer systems 308. In another embodiment, as will be discussed in greater detail further herein, the system 300 may perform a sum and difference operation optically, wherein a selected wave-front sensor of the system 300 may receive one signal representative of the sum of the first and second phase distributions and a second signal representative of the difference between the first and second phase distributions.

In step 410, the system 300 may determine a first phase tilt along one direction of a pupil plane 103 of the metrology system 302 for the $Sum^{1,2}$ generated in step 406. For example, the system 300 may determine the net change in the phase of light associated with the sum of the first and second distribution as a function of position across the pupil plane 103 of an imaging pathway of the primary optical axis of the metrology system 202. In step 412, the system 300 may determine a second phase tilt along a direction of the pupil plane 103 of an image pathway of the metrology system 302 for the $Diff^{1,2}$ generated in step 408. Throughout the present disclosure the first and second phase tilts of process 400 may be referred to as $Tilt^{1+2}$ and $Tilt^{1-2}$ respectively.

In step 414, the system 300 may calibrate phase tilt versus overlay data utilizing the second phase tilt of step 412 and the magnitude of the intentional first and second overlay of the first and second targets. It should be recognized that the second phase tilt corresponds to the phase tilt value associated with twice the magnitude of the intentional overlay, $OVL_I$. As such, it is straightforward to relate the measured phase tilt with a known level of overlay, namely $OVL_I$ (i.e., "intentional overlay").

In step 416, the system 300 may determine a test overlay value associated with the first 303 and second 305 overlay targets by comparing the first phase tilt of step 410 to the calibrated set of phase tilt versus overlay data determined in step 414. It should be recognized that the first phase tilt corresponds to the phase tilt value associated with twice the magnitude of the test overlay associated with target 303 and/or 305. As it is recognized that in a general sense the phase tilt is approximately related to the actual overlay of one or more targets linearly, the calibration results of step 414 along with the first phase tilt determined in step 410 may be utilized to determine the test overlay value. The approximated test overlay is given by:

$$OVL_T = OVL_I \times \left(\frac{Tilt^{1+2}}{Tilt^{1-2}}\right) \quad (Eq. 5)$$

Figure 5:
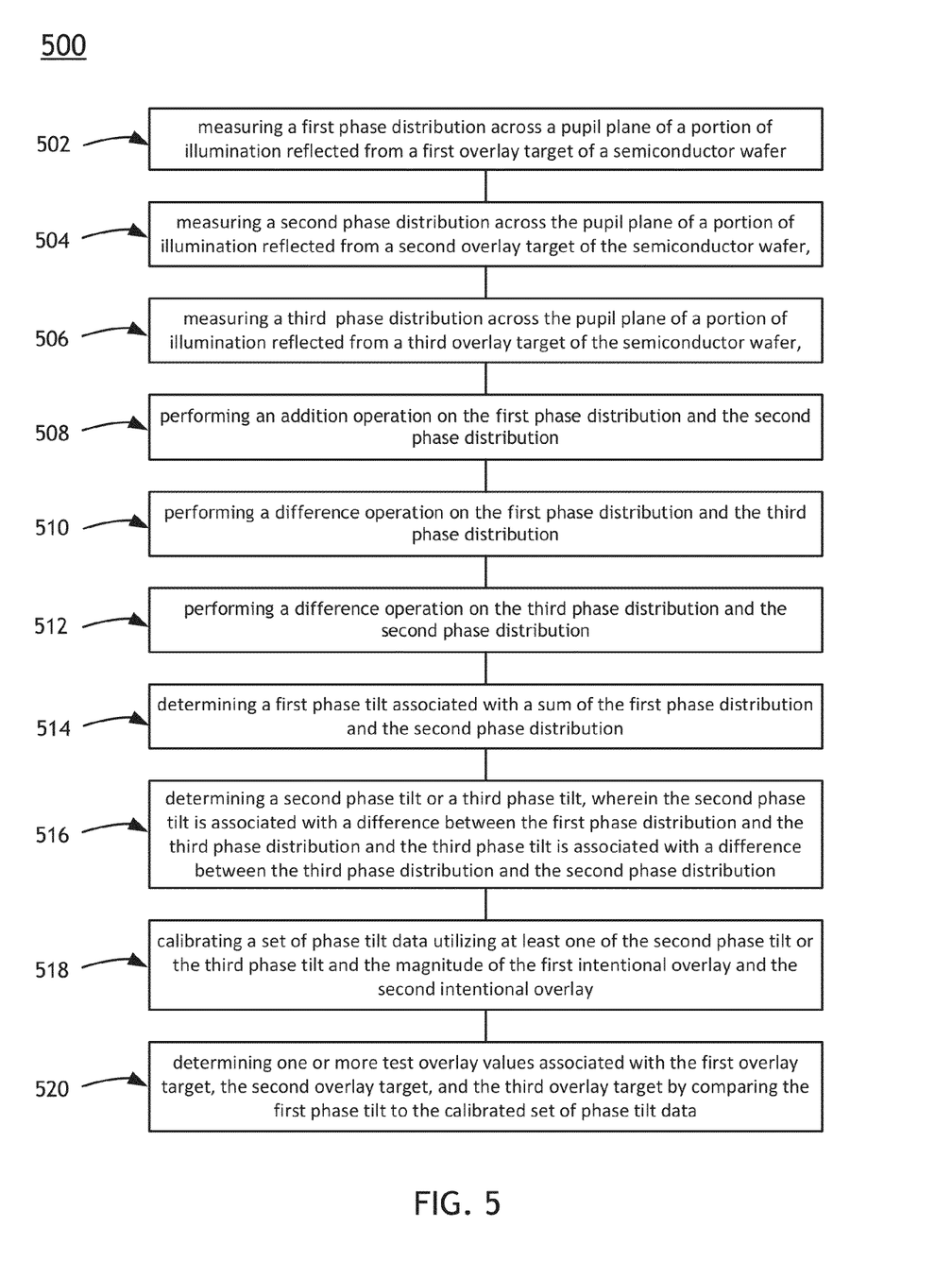
FIG. 5 is a flow diagram illustrating a method for measuring overlay utilizing pupil phase information, in accordance with an alternative embodiment of the present invention.

FIG. 5 illustrates an alternative process flow 500 suitable for implementation by the system 300 of the present invention. In contrast to process flow 300, process flow 500 provides a measurement and analysis routine which implements the measurement and analysis of pupil phase information from three overlay targets. In step 502, in a manner similar to step 402 of process 400, the phase based metrology system 302 of the system 300 may measure a phase distribution of illumination reflected from a first target 303 of the semiconductor wafer 105, wherein the first target 303 is fabricated to include a known or intentional overlay (in addition to the unknown 'test' overlay). In step 504, the phase based metrology system 302 may measure a phase distribution of illumination reflected from a second target 305, the second target is fabricated to have an overlay which has the same magnitude but opposite displacement direction of the intentional overlay of step 502. In step 506, the phase based metrology system 302 may measure a phase distribution of illumination reflected from a third overlay target 307, wherein the third overlay target 307 is constructed to have zero intentional overlay, such that the measured overlay of target 307 consists of only the test overlay. In this manner, the measured overlay of each of the three overlay targets 303, 305, and 307 may be represented by:

$$OVL_M^1 = OVL_T + OVL_I \quad (Eq. 6)$$

$$OVL_M^2 = OVL_T - OVL_I \quad (Eq. 7)$$

$$OVL_M^3 = OVL_T \quad (Eq. 8)$$

In step 508, the system 300 may determine a sum of the first phase distribution and the second phase distribution. In step 510, the system 300 may calculate a difference between the first phase distribution and the third phase distribution. In step 512, the system 300 may determine a difference between the third phase distribution and the second phase distribution. In this sense the Sum$^{1,2}$, Diff$^{1,3}$, and Diff$^{3,2}$ functions are expressed as:

$$Sum^{1,2} = \phi_1 + \phi_2 \quad \text{(Eq. 9)}$$

$$Diff^{1,3} = \phi_1 - \phi_3 \quad \text{(Eq. 10)}$$

$$Diff^{3,2} = \phi_3 - \phi_2 \quad \text{(Eq. 12)}$$

wherein $\phi_1$, $\phi_2$, and $\phi_3$ represent the first, second, and third phase distributions respectively. In one embodiment, the system 300 may perform the sum and difference operations of steps 508 through 512 utilizing a pre-programmed algorithm executed by one or more processors of the one or more computer systems 308. In another embodiment, the system 300 may perform the sum and difference operations optically.

In step 514, the system 300 may determine a first phase tilt along one direction of a pupil plane 103 of the metrology system 302 for the Sum$^{1,2}$ generated in step 508. In step 516, the system 300 may determine a second phase tilt along a direction of the pupil plane 103 of an image pathway of the metrology system 302 for the Diff$^{1,3}$ function generated in step 510. In step 518, the system 300 may determine a third phase tilt along a direction of the pupil plane 103 of an image pathway of the metrology system 302 for the Diff$^{3,2}$ function generated in step 512. Throughout the present disclosure the first, second, and third phase tilts of process 500 may be referred to as Tilt$^{1+2}$, Tilt$^{1-3}$ and Tilt$^{3-2}$ respectively.

In step 518, the system 300 may calibrate phase tilt versus overlay data utilizing either the second phase tilt or the third phase tilt of step 516 and the magnitude of the intentional first and second overlay of the first and second targets. It should be recognized that the second and third phase tilt correspond to the phase tilt value associated with twice the magnitude of the intentional overlay, OVL$_I$. As such, as in process 400, it is straightforward to relate the measured phase tilt with a known level of overlay, namely OVL$_I$ (i.e., "intentional overlay"). It is further recognized that both the second phase tilt and the third phase tilt may be utilized to calibrate the phase tilt versus overlay data. For example, the second phase tilt and third phase tilt values of 516 may be averaged and then used to calibrate the phase tilt versus overlay data. In another example, both the second phase tilt and the third phase tilt of step 516 may be individually used to calibrate phase tilt versus overlay data. Then, the sets of calibrated phase tilt versus overlay data may be averaged or otherwise statistically combined to form a composite set of phase tilt versus overlay data.

In step 520, the system 300 may determine a test overlay value associated with the first 303, second 305, and third overlay 307 targets by comparing the first phase tilt of step 514 to the calibrated set of phase tilt versus overlay data determined in step 518. It should be recognized that the first phase tilt corresponds to the phase tilt value associated with twice the magnitude of the test overlay associated with targets 303, 305, and 307. As it is recognized that in a general sense the phase tilt is approximately related to the actual overlay of one or more targets linearly, the calibration results of step 518 along with the first phase tilt determined in step 514 may be utilized to determine the test overlay value. The approximated test overlay can be expressed in terms of Tilt$^{1-3}$ and Tilt$^{3-2}$ by the following equations:

$$OVL_T = OVL_I \times \left( \frac{Tilt^{1+2}}{Tilt^{1-3}} \right) \quad \text{(Eq. 13)}$$

$$OVL_T = OVL_I \times \left( \frac{Tilt^{1+2}}{Tilt^{3-2}} \right) \quad \text{(Eq. 14)}$$

It is noted that the numerical calculations of process 400 and 500 may be carried out via a set of one or more pre-programmed algorithms executed by one or more processors of the computer system 308. It is recognized that the set of pre-programmed algorithms may include, but are not limited to, a phase analysis algorithm 313 configured to calculate sums and differences of two or more measured phase distributions, a phase tilt algorithm 314 configured to determine the phase tilt of the sum and differential data sets as function of position across the pupil plane, and a calibration algorithm 315 configured to calibrate the phase tilt versus overlay data and determine the test overlay value. It is further recognized that the above algorithms are not limiting, but should be interpreted merely as illustrative.

An additional aspect of the present invention is the limitation of abberative and focus error effects. As a result of the difference operations, aberrations, often prohibitive in low cost optical systems, are inherently cancelled out in the processes 400 and 500 discussed previously herein. As such, lower cost optical components may be utilized in the present invention. Further, some focus aberrations (but not all) are cancelled out in the difference operations of processes 400 and 500 described above.

Referring generally to FIGS. 6 through 9, the systems 600, 700, 800, and 900 illustrate embodiments of the metrology system 302 of FIG. 3. It is contemplated herein that systems 600, 700, 800, and 900 may be utilized to carry out the process flows 400 and 500 described previously herein. In a general sense, each of the systems 600, 700, 800, and 900 are directed at optical configurations suitable for carrying out phase based overlay metrology utilizing two or more metrology targets.

Figure 6:
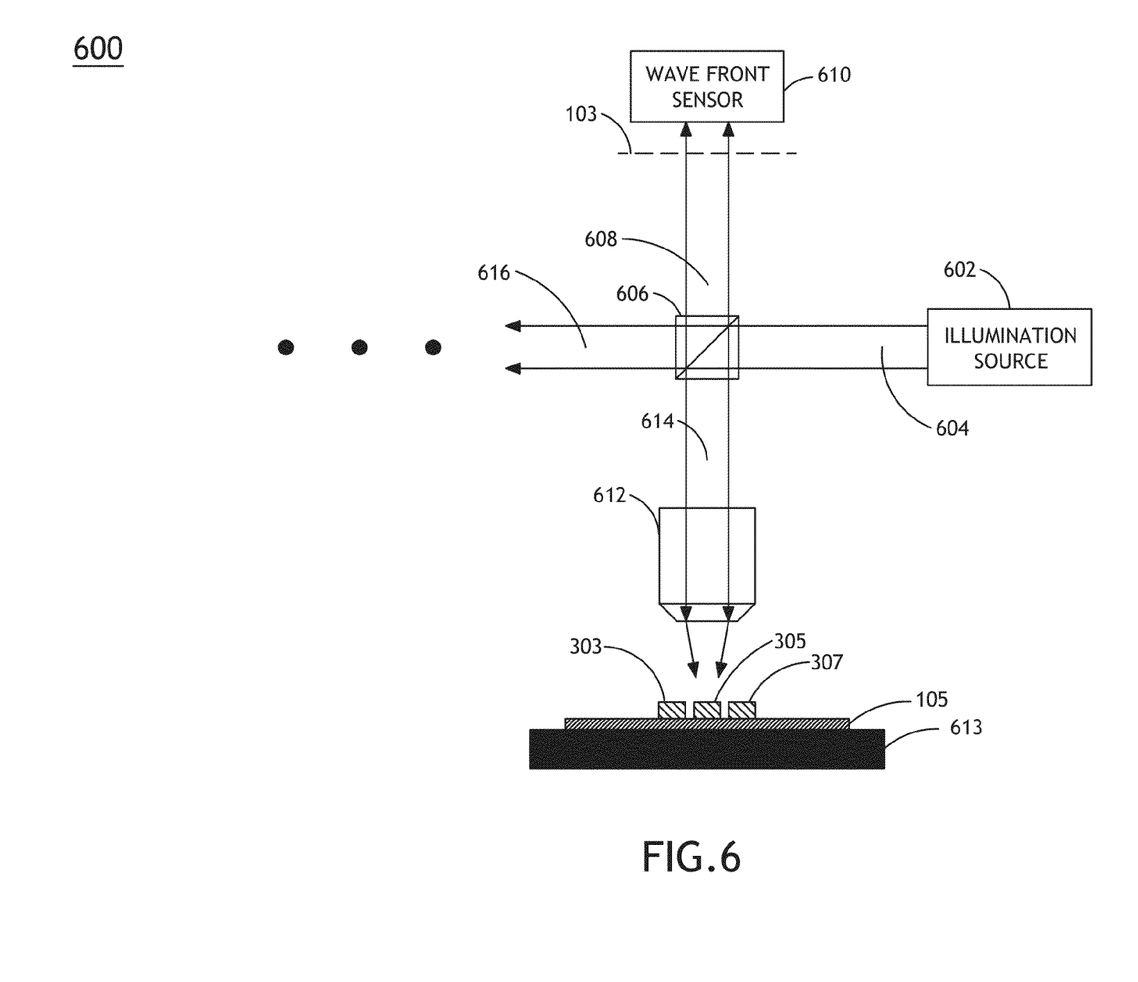
FIG. 6 is a block diagram illustrating an embodiment of a phase based metrology system of the system for measuring overlay utilizing pupil phase information, in accordance with one embodiment of the present invention.

FIG. 6 illustrates a phase based metrology system 600, in accordance with one embodiment of the metrology system 302 of FIG. 3. The phase based metrology system 600 may include, but is not limited to, an illumination source 602, beam splitter 606, an objective lens 612, and a wave-front sensor 610 located in the pupil plane 103 configured to analyze the phase distribution of illumination reflected from the two or more targets (e.g., 303, 305, or 307) of the specimen 105 (e.g., semiconductor wafer) as a function of position across the pupil plane 103.

The illumination source 602 of the system 600 may include any illumination source known in the art. In one embodiment, the illumination source 602 may include a narrowband light source. It should be recognized that any known narrowband light source is suitable for implementation in the present invention. For example, the illumination source 602 may include, but is not limited to, one or more laser light sources. In another embodiment, the illumination source 602 may include a broadband light source (e.g., white light source). For example, the illumination source 602 may include, but is not limited to, a halogen light source (HLS). For instance, the halogen light source may include, but is not limited to, a tungsten based halogen lamp. In another example, the illumination source 602 may include a Xenon arc lamp.

In another aspect of the present invention, the beam splitter 606 of the system 600 may split the light beam emanating from an illumination source 602 into two paths: an object path 614 and a reference path 616. In this sense, the object path 614 and the reference path 616 of the system 600 may form a portion of a two beam interference optical system. For example, the beam splitter 606 may direct a first portion of the beam of light from the illumination path 604 along the object path 614, while allowing a second portion of the beam of light from the illumination path 604 to be transmitted along the reference path 616. More specifically, the beam splitter 606 may direct a portion of the light emanating from the illumination source 606 to the surface of the specimen 105 (e.g., via object path 614) disposed on the specimen stage 613. Moreover, the beam splitter 606 may transmit a second portion of the light emanating from the illumination source 604 to the components of the reference path 616, which may be utilized during interference based focusing efforts of the system. For instance, the beam splitter 606 may transmit a portion of light from the illumination path 604 along the reference path 616 to a reference mirror (not shown). It should be recognized by those skilled in the art that any beam splitter known in the art is suitable for implementation as the beam splitter 606 of the present invention.

In another embodiment, the system 600 may include a main objective lens 612. The main objective lens 612 may aid in directing light along the object path 614 to the surface of the specimen 105 disposed on the specimen stage 613. For example, the beam splitter 606 may direct a portion of the light beam emanating from the illumination source 602 along the object path 614. Following the splitting process by the beam splitter 606, the main objective lens 612 may focus light from the object path 614, which may be collinear with the primary optical axis (not labeled), onto the surface of the specimen 105. In a general sense, any objective lens known in the art may be suitable for implementation as the main objective lens 612 of the present invention.

Further, a portion of the light impinging on the surface of the specimen 105 may be reflected by the one or more overlay targets (e.g., 303, 305, or 307) and directed along the primary optical axis via the objective 612 and the beam splitter 606 toward the wave-front sensor 610. It should be further recognized that intermediate optics devices such as intermediate lenses, additional beam splitters (e.g., a beam splitter configured to split off a portion of light to a focusing system), and imaging lenses may be placed between the objective 612 and the wave-front sensor 610.

In another aspect of the present invention, the wave-front sensor 610 of the system 600 may be disposed in the pupil plane 103 along the primary optical axis of the system 600, as shown in FIG. 6. In this regard, the wave-front sensor 610 may be arranged to collect phase distribution information from the two or more overlay targets (e.g., 303, 305, or 307) disposed on one or more layers of the specimen 105 as a function of position across the pupil. For example, in a general sense, after reflecting from the two or more overlay targets of the specimen 105, light may travel along the primary optical axis to the wave-front sensor 610 via the main objective 612 and the beam splitter 606. It is recognized that any wave-front sensor known in the art is suitable for implementation in the present invention. For example, the wave-front sensor 610 may include a Hatmann-Schack wave-front sensor.

In a further aspect, the sensor 610 may be communicatively coupled with a computer system 308, as shown in FIG. 3. In this regard, digitized phase distribution data (e.g., phase imagery data) may be transmitted from the wave-front sensor 610 of the phase based metrology system 600 to the computer system 308 via a signal, such as a wireline signal (e.g., copper line, fiber optic cable, and the like) or a wireless signal (e.g., wireless RF signal). In this manner, upon measuring the phase distribution data as a function of pupil position via the wave-front sensor 610, the system 300 may determine phase tilt and, in turn, the 'test' overlay of the overlay targets 303, 305, or 307 utilizing the one or more computer systems 308. In this regard, the wave-front sensor 610 may be utilized to, in part, carry out process flows 400 or 500. It should be recognized, however, that the phase based metrology system 600 (as well as the system 300) may be used to carry out phase based metrology in manners different from the processes 400 or 500 described previously herein.

While the above description describes the wave-front sensor 610 as being located along the primary optical axis of the system 600, this characteristic should not be interpreted as a requirement. It is contemplated herein that the sensor 610 may reside along an additional optical axis of the system 600. For example, in a general sense, one or more additional beam splitters may be utilized to divert a portion of light reflected from the surface of the specimen 105 and traveling along the object path 614 onto an additional optical axis, which is non-parallel to the object path 614. The sensor 610 may be arranged such that light traveling along the additional optical axis impinges on the wave-sensor 610.

Figure 7:
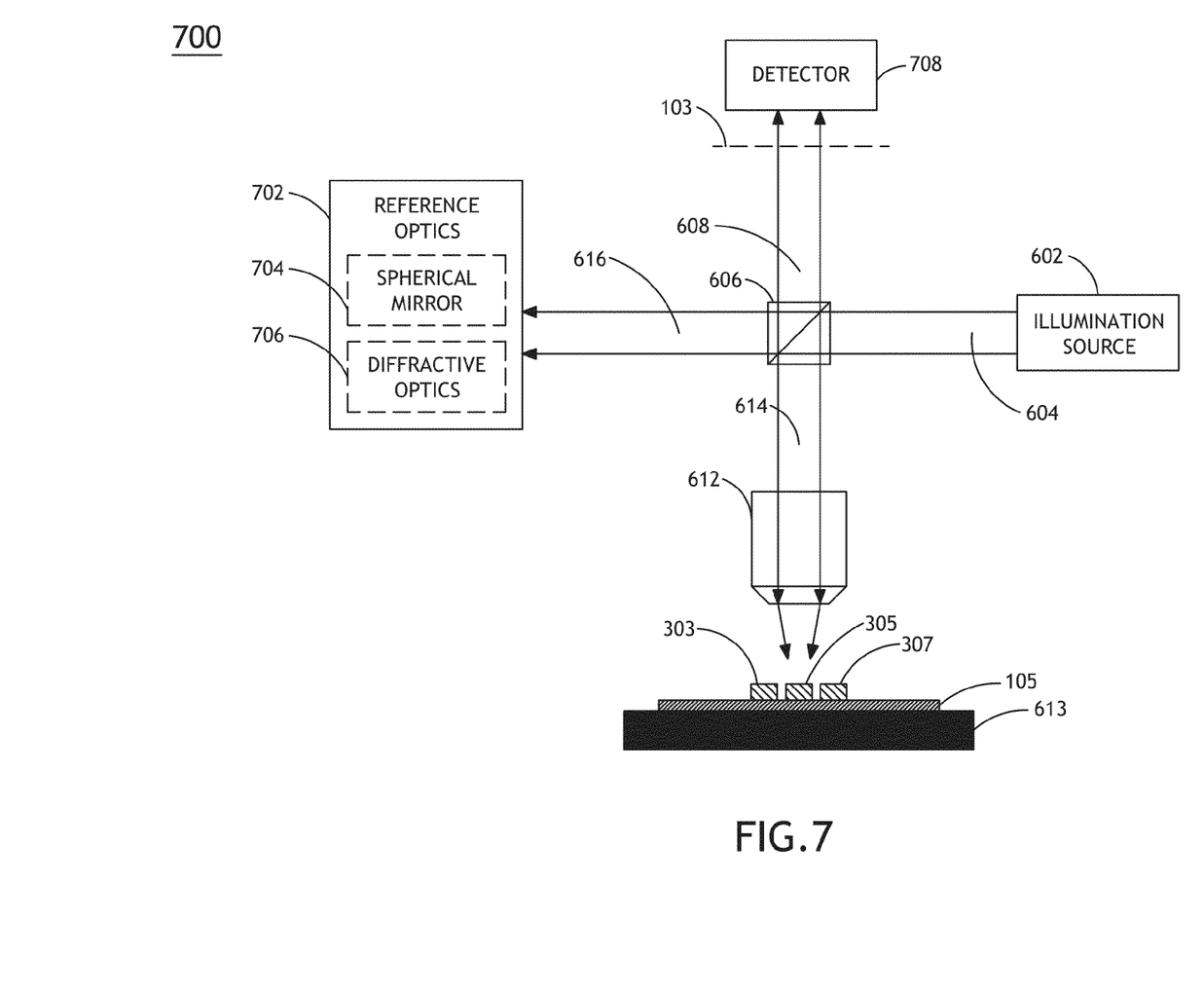
FIG. 7 is a block diagram illustrating an embodiment of a phase based metrology system of the system for measuring overlay utilizing pupil phase information, in accordance with one embodiment of the present invention.

FIG. 7 illustrates a phase based metrology system 700, in accordance with one embodiment of the metrology system 302 of FIG. 3. The phase based metrology system 700 may include, but is not limited to, an illumination source 602, beam splitter 606, an objective lens 612, a set of reference optics 702 configured to provide an interferometric reference signal across the pupil of the system 700, and an intensity detector 708 located in the pupil plane 103 configured to analyze the phase distribution of illumination reflected from the two or more targets (e.g., 303, 305, or 307) of the specimen 105 (e.g., semiconductor wafer) as a function of position across the pupil plane 103.

It is recognized herein that the illumination source 602, the beam splitter 606, and the specimen stage 613 of FIG. 7 are similar to the like components of FIG. 6 described previously herein. As such, the description of system 600 should be interpreted to extend to system 700 except where otherwise provided.

In one aspect of the present invention, the phase based metrology system 700 may be configured as a two-beam interferometric optical system. The reference path 616 of the system 700 may include a set of reference optics 702 configured to provide a reference signal across the pupil plane 103 of the optical system 700. In this manner, illumination reflected from the reference optics 702 of the reference pathway 616 may interfere with illumination reflected from the two or more overlay targets (e.g., 303, 305, or 307) of the semiconductor wafer 105. It should be recognized by those skilled in the art that the intensity of the combined reference beam illumination and sample illumination (i.e., illumination from overlay targets) may be directly related to the relative phase between the reference beam illumination and the reflected sample illumination. As such, by measuring the illumination information as a function of pupil position, the phase distribution across the pupil may be inferred.

It should be apparent to those skilled in the art that the reference path 616 may include, but is not limited to, reference optics 702 (e.g., reference mirror), and a reference objective (not shown). In a general sense, a two-beam interference optical system may be configured as a Linnik interferometer. Linnik interferometry is described generally in U.S. Pat. No. 4,818,110, issued on Apr. 4, 1989, and U.S. Pat. No. 6,172,349, issued on Jan. 9, 2001, which are incorporated herein by reference.

In further aspect of the present invention, the reference optics 702 configured to provide an interferometric reference signal across the pupil of the system 700 may include, but are not limited to, a spherical mirror 704 or a set of diffractive optics 706 (e.g., holographic mirror). For example, a spherical mirror 704 may be utilized as the reference mirror in the reference pathway 616 of the system 700. In this manner, the spherical mirror 704 may act to transmit a reference signal across the entire (or nearly the entire) pupil. As such, as described above, the light reflected from the spherical mirror 704 of the reference pathway 616 may then interfere with light from the two or more targets 303, 305, or 307 to produce a combined interference signal across the entire pupil plane 103, allowing the system 700 to infer the phase distribution. By way of further example, the utilization of diffractive optics 706 may lead to the reflection of reference beam illumination to multiple pupil points, as opposed to a continuous distribution of reference light across the pupil plane. It is recognized herein that the utilization of a spherical mirror 704 or diffractive optics 706 is particularly advantageous when compared to a planar reference mirror as the plane reference mirror will provide reference illumination concentrated primarily at the center of the pupil plane (centered about the imaging pathway 608).

In another aspect of the present invention, the illumination from the illumination source 602 may be low numerical aperture (NA) illumination. It should be recognized by those skilled in the art that the utilization of low NA illumination produces a clearer object image of the two or more targets 303, 305, or 307 at the pupil plane 103.

It should be further recognized that intermediate optical devices such as intermediate lenses, additional beam splitters (e.g., a beam splitter configured to split off a portion of light to a focusing system), and imaging lenses may be placed between the objective 612 and the imaging plane of the detector 708.

In another aspect of the present invention, the detector 708 of the system 700 may be disposed along the primary optical axis of the system 700. In this regard, the detector 708 may be arranged to collect imagery data from the surface of the specimen 105. For example, in a general sense, after reflecting from the surface of the specimen 105, light may travel along the primary optical axis to the image plane of the detector 708 via the main objective 612 and the beam splitter 606. It is recognized that any detector system known in the art is suitable for implementation in the present invention. For example, the detector 708 may include a charge coupled device (CCD) based camera system. By way of another example, the detector 110 may include a time delay integration (TDI)-CCD based camera system.

In a further aspect, the detector 708 may be communicatively coupled with a computer system 308, as shown in FIG. 3. In this regard, digitized imagery data (e.g., intensity based imagery data) may be transmitted from the intensity detector 708 of the phase based metrology system 700 to the computer system 308 via a signal, such as a wireline signal (e.g., copper line, fiber optic cable, and the like) or a wireless signal (e.g., wireless RF signal). In this manner, upon measuring the intensity distribution data as a function of pupil position via the detector 708, the system 300 may determine the phase distribution and, in turn, the phase tilt of the illumination and the 'test' overlay of the overlay targets 303, 305, or 307. In this regard, the intensity detector 708 may be utilized to, in part, carry out process flows 400 or 500. It should be recognized, however, that the phase based metrology system 700 (as well as the system 300) may be used to carry out phase based metrology in manners different from the processes 400 or 500 described previously herein.

While the above description describes the detector 708 as being located along the primary optical axis of the system 700, this characteristic should not be interpreted as a requirement. It is contemplated herein that the detector 708 may reside along an additional optical axis of the system 700. For example, in a general sense, one or more additional beam splitters may be utilized to divert a portion of light reflected from the surface of the specimen 105 and traveling along the object path 614 onto an additional optical axis. The detector 708 may be arranged such that light traveling along the additional optical axis impinges the image plane of the detector 708.

Figure 8:
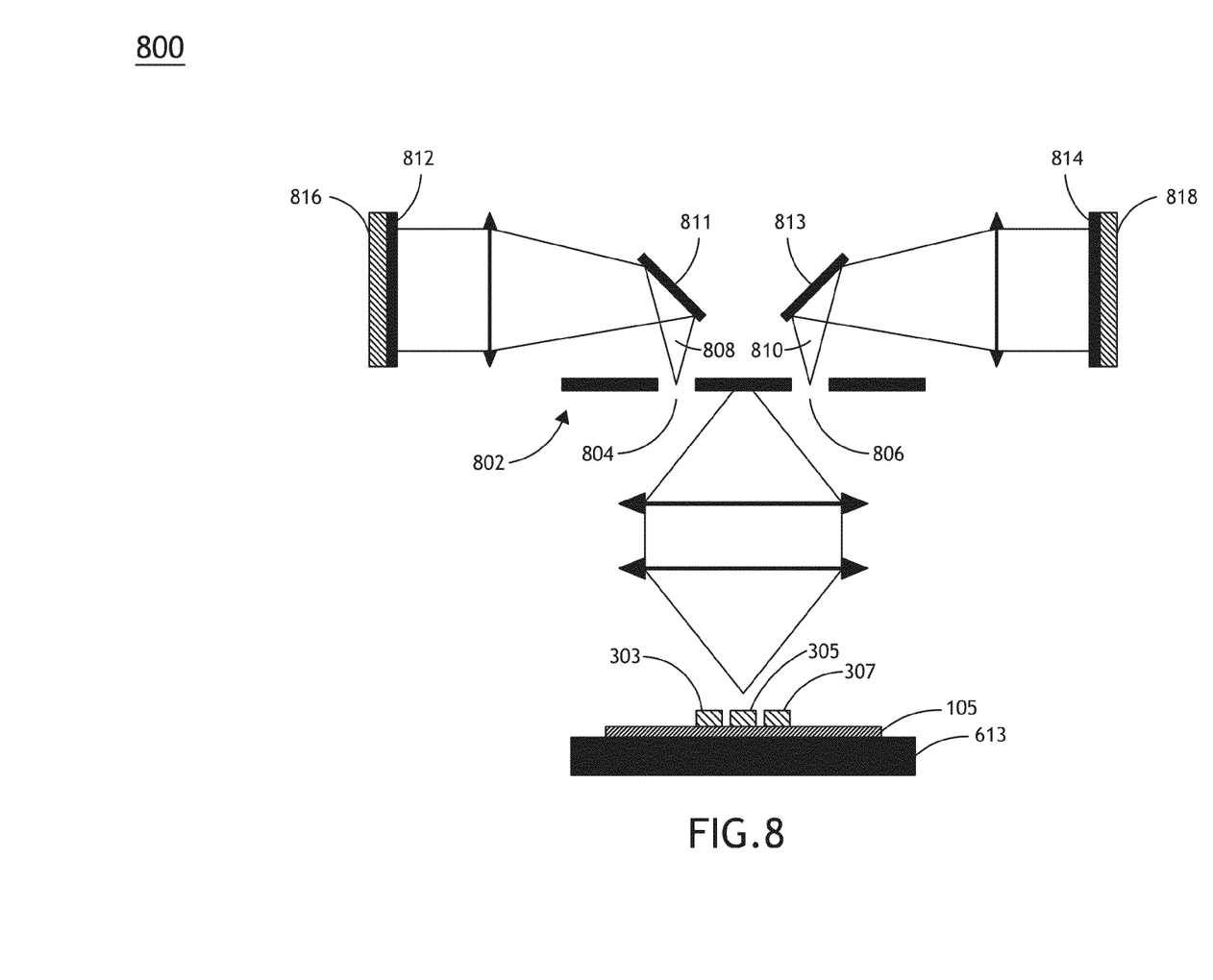
FIG. 8 is a block diagram illustrating an embodiment of a phase based metrology system of the system for measuring overlay utilizing pupil phase information, in accordance with one embodiment of the present invention.

FIG. 8 illustrates a phase based metrology system 800 configured to measure two or more overlay targets simultaneously, in accordance with one embodiment of the metrology system 302 of FIG. 3. In one aspect, the phase based metrology system 800 is configured to provide simultaneous phase analysis of the phase distributions associated with the illumination reflected from the first overlay target 303 and the second overlay target 305. The phase based metrology system 800 may include, but is not limited to, a set of field stops 802 including a first field stop 804 and a second field stop 806, a first mirror 811, a second mirror 813, a first wave-front sensor 816, and a second wave-front sensor 818. It is noted that except where otherwise provided the description above related to FIGS. 6 and 7 should be interpreted to extend to FIG. 8.

In one aspect, illumination reflected from the surface of the specimen 105 including two or more overlay targets 303, 305, or 307 may be divided into a first channel 808 and a second channel 810 via the first field stop 804 and the second field stop 806 respectively. In this regard, the field stops 804 and 806 may be positioned according to the overlay target locations, with each field stop aligned with a selected overlay target.

In another aspect, the illumination from the first channel 808 may be directed toward the surface 812 of a first wave-front sensor 816 via a first mirror 811. Similarly, the illumination from the second channel 810 may be directed toward the surface 814 of the second wave-front sensor 818.

In a further aspect, the wave-detectors 816 and 818 acquire pupil phase imagery data simultaneously. As such, the system 800 allows for the simultaneous phase distribution analysis of illumination from two or more overlay targets (e.g., 303 or 305).

In a further embodiment, each of the field stops 804 and 806 may include an apodizing filter. It should be recognized that the utilization of apodizing filters on both field stop 804 and field stop 806 aids in eliminating the possibility of diffraction.

Figure 9:
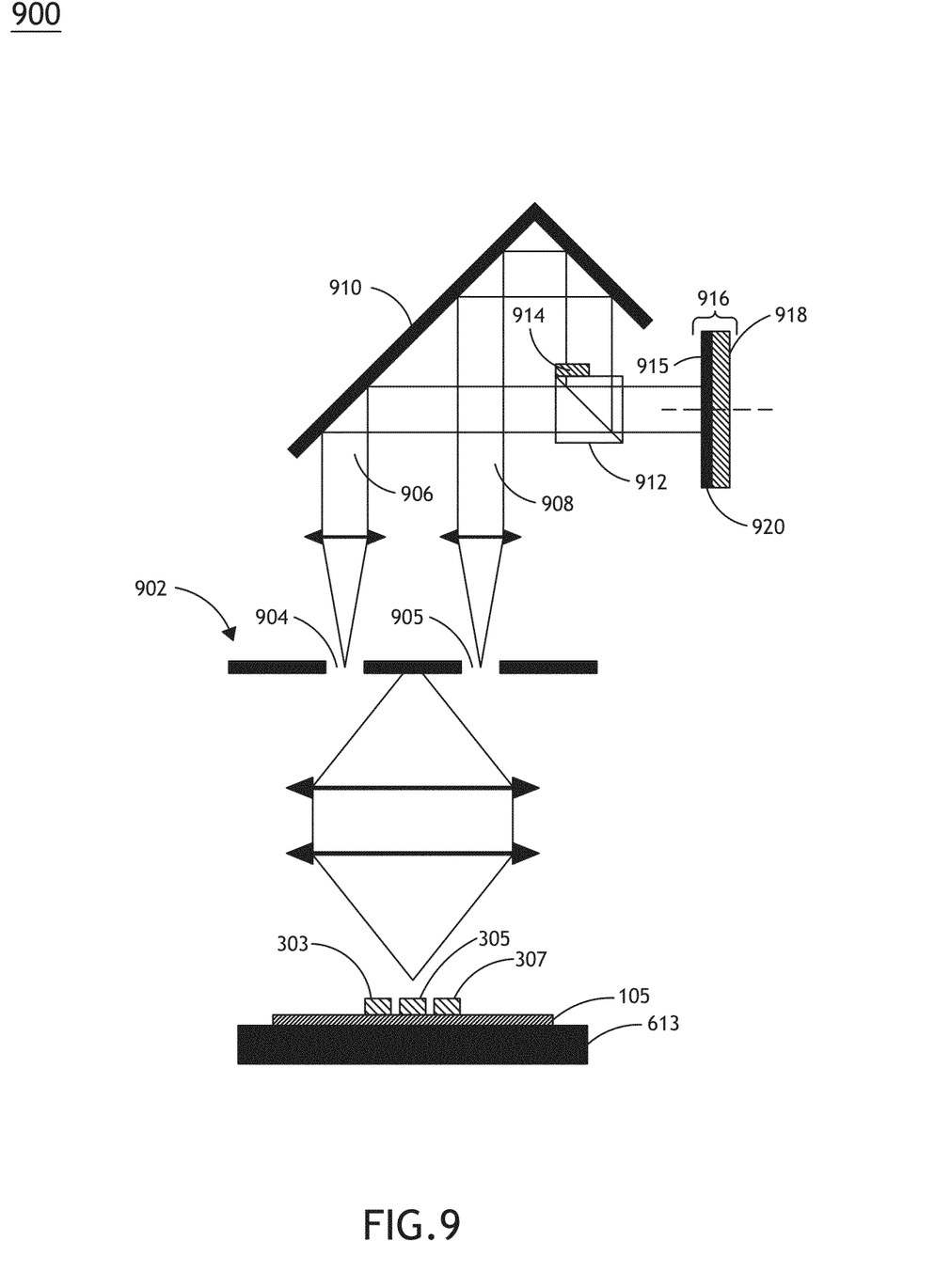
FIG. 9 is a block diagram illustrating an embodiment of a phase based metrology system of the system for measuring overlay utilizing pupil phase information, in accordance with one embodiment of the present invention.

It is further contemplated that the phase based metrology system 800 may allow for the execution of process flows 400 and 500 via simultaneous target information acquisition FIG. 9 illustrates a phase based metrology system 900 configured to provide optical calculation of difference images and summed images, in accordance with one embodiment of the metrology system 302 of FIG. 3. In one aspect, the phase based metrology system 900 is configured to carry out the difference and summing operations (as describe above with respect to processes 400 and 500) of phase distributions (e.g., phase image) associated with the illumination reflected from the first overlay target 303 and the second overlay target 305. The phase based metrology system 900 may include, but is not limited to, a set of field stops 902 including a first field stop 904 and a second field stop 905, a 90° mirror 910, a beam splitter 912, a half-wave retarder 914 and a wave-front sensor 916. It is noted that except where otherwise provided the description above related to FIGS. 6, 7, and 8 should be interpreted to extend to FIG. 9.

In one aspect, illumination reflected from the surface of the specimen 105 including two or more overlay targets 303, 305, or 307 may be divided into a first channel 906 and a second channel 908 via the first field stop 904 and the second field stop 905 respectively. In this regard, the field stops 904 and 905 may be positioned according to the overlay target locations, with each field stop aligned with a selected overlay target.

In a further aspect, illumination from the first channel 906 and the second channel 908 is directed toward the first arm of the 90° mirror 910. Further, the 90° mirror is arranged to reflect the illumination of the first channel 906 toward the beam splitter 912 and onto the wave-front detector 916. The 90° mirror is also arranged to reflect the illumination of the second channel 908 from the first arm of the 90° mirror to a second arm of the 90° mirror and then toward the beam splitter 912, which diverts the illumination onto the wave-front sensor 916.

Additionally, a half-beam retarder 914 is position along the second channel 908 such that at least a portion of the illumination of the second channel 908 is phase delayed. In this regard, a portion of the illumination incident on the wave-front sensor 916 consists of "summed" waveforms, while the remaining portion of the wave-front sensor 916 receives the "subtracted" waveforms. For example, as shown in FIG. 9, the portion of the illumination of the second channel 908 processed with the retarder 914 may act to destructively interfere with a portion of the illumination from the first channel 906. As such, the combined illumination impinging on the first portion 915 of the wave-sensor 916 may represent the "subtracted" set waveforms. In contrast, the portion of the second channel 908 which goes unprocessed by the retarder 914 may act to constructively interfere with the remaining portion of the first channel 906. As such, the combined distributions impinging on the second portion 920 of the wave-sensor 916 may represent the "summed" set of waveforms.

It is contemplated herein that the various systems of the present invention may consist (but not required to consist) of adapting or reconfiguring presently existing optical metrology systems. For instance, the present invention may consist of adapting the KLA-Tencor Archer 100 overlay control system. For example, the phase based metrology system 600 illustrated above in FIG. 6 may be constructed, in part, by integrating a wave front sensor along the imaging pathway of a traditional overlay metrology system (e.g., Archer 100 system). In another example, the phase based metrology system 700 illustrated above in FIG. 7 may be constructed, in part, by replacing the reference optics of a traditional overlay metrology system with a spherical mirror or holographic mirror. It should be recognized that the present invention is not limited to an adaptation of an Archer 100 system, but rather the description above should be interpreted merely as an illustration. It is anticipated that the present invention may be extended to a wide variety of microscopy and overlay metrology systems, as well as existing independently of pre-existing systems.

In an additional aspect of the present invention, as a result of the measured phase tilt being generally uniform along a given direction of the pupil (i.e., linear), overlay information may be derived from any two symmetric positions. As such, additional information may be extracted from the given illumination by dividing the pupil into symmetric sections coded by wavelength and/or polarization.

In embodiment, the pupil 103 may be divided into a plurality of symmetrical sections utilizing a selected spatial variable filter. For example, the pupil may be divided based on polarization so that each section senses a defined polarization.

In another example, the pupil may be divided based on spectral information such that each section of the pupil senses a defined wavelength of illumination.

It is further contemplated that the division of the pupil into symmetric sections on the basis of a selected measurable quantity, such as wavelength or polarization, may be extended to all of the various embodiments to the present invention.

In another aspect of the present invention, it is contemplated herein that the overlay metrology performed on the two or more overlay targets may be carried out via multiple illumination sources, each of which has a different wavelength. In this regard, for example, the phase distribution and phase tilt analysis provided in processes 400 and 500 may be carried out utilizing multiple-wavelengths of illumination. In one embodiment, phase tilt versus measured overlay data may be calibrated utilizing the data acquired during measurements of illumination exposures with different wavelength illumination. In this regard, it is anticipated that phase based overlay metrology may be carried out utilizing a single target measurement.

It should be recognized by those skilled in the art that the measured characteristics (e.g., overlay error) of the present invention may be utilized to improve control of subsequent lithographic processes and to determine whether the quality of a lithographic pattern meets predetermined requirements. In one embodiment, overlay metrology data may be used to calculate an overlay correctable, a dose correctable, or a focus correctable for each field of the measured wafer 105. These correctable values may then be sent to a lithography tool to improve the lithography tools performance. In a general sense, the correctable data may be used to correct the alignment of a lithography tool (e.g., stepper) or scanner tool to improve the control of subsequent lithographic patterning with respect to overlay performance.

It should further be recognized by those skilled in the art that the techniques for determining overlay described herein may be suitable for a wide variety of photolithography processes, such as semiconductor device fabrication photolithographic process, optical device manufacturing, micro-mechanical manufacturing, and the like.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

It is further contemplated that each of the embodiments of the method described above may include any other step(s) of any other method(s) described herein. In addition, each of the embodiments of the method described above may be performed by any of the systems described herein.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

Furthermore, it is to be understood that the invention is defined by the appended claims.

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed:

1. A method for measuring overlay utilizing pupil phase information, comprising:
    measuring a first phase distribution across a pupil plane of a portion of illumination reflected from a first overlay target of a semiconductor wafer, wherein the first overlay target is fabricated to have a first intentional overlay;
    measuring a second phase distribution across the pupil plane of a portion of illumination reflected from a second overlay target of the semiconductor wafer, wherein the second overlay target is fabricated to have a second intentional overlay, wherein the second intentional overlay is along a direction opposite to the first intentional overlay, wherein the first intentional overlay and the second intentional overlay have substantially the same magnitude;
    determining a first phase tilt associated with a sum of the first phase distribution and the second phase distribution;
    determining a second phase tilt associated with a difference between the first phase distribution and the second phase distribution;
    calibrating a set of phase tilt data utilizing the determined second phase tilt and the magnitude of the first and second intentional overlay; and
    determining a test overlay value associated with the first overlay target and the second overlay target by comparing the first phase tilt to the calibrated set of phase tilt data.

2. The method of claim 1, wherein at least one of the first phase distribution or the second phase distribution comprises:
    a two-dimensional phase image.

3. The method of claim 1, wherein at least one of the sum of the first phase distribution and the second phase distribution or the difference between the first phase distribution and the second phase distribution is performed via a phase analysis algorithm.

4. The method of claim 1, wherein at least one of the first phase distribution and the second phase distribution or the difference between the first phase distribution and the second phase distribution is performed optically.

5. The method of claim 1, wherein the measurement of the first distribution from the first overlay target and the measurement of the second distribution from the second overlay target are performed substantially simultaneously.

6. The method of claim 1, wherein the illumination reflected from the first overlay target and the illumination reflected from the second overlay target comprises at least one of narrow band illumination or broad band illumination.

7. A method for measuring overlay utilizing pupil phase information, comprising:
    measuring a first phase distribution across a pupil plane of a portion of illumination reflected from a first overlay target of a semiconductor wafer, wherein the first overlay target is fabricated to have a first intentional overlay having a selected magnitude along a selected direction;
    measuring a second phase distribution across the pupil plane of a portion of illumination reflected from a second overlay target of the semiconductor wafer, wherein the second overlay target is fabricated to have a second intentional overlay, wherein the second intentional overlay is along a direction opposite to the first intentional overlay, wherein the first intentional overlay and the second intentional overlay have substantially the same magnitude;
    measuring a third phase distribution across the pupil plane of a portion of illumination reflected from a third overlay target of the semiconductor wafer, wherein the third overlay target is fabricated to have zero intentional overlay;
    determining a first phase tilt associated with a sum of the first phase distribution and the second phase distribution;
    determining at least one of a second phase tilt or a third phase tilt, wherein the second phase tilt is associated with a difference between the first phase distribution and the third phase distribution and the third phase tilt is associated with a difference between the third phase distribution and the second phase distribution;
    calibrating a set of phase tilt data utilizing at least one of the second phase tilt or the third phase tilt and the magnitude of the first intentional overlay and the second intentional overlay; and
    determining one or more test overlay values associated with the first overlay target, the second overlay target, and the third overlay target by comparing the first phase tilt to the calibrated set of phase tilt data.

8. The method of claim 7, wherein at least one of the first phase distribution, the second phase distribution, or the third phase distribution comprises:
    a two-dimensional phase image.

9. The method of claim 7, wherein at least one of the sum of the first phase distribution and the second phase distribution, the difference between the first phase distribution and the third phase distribution, or the difference between the third phase distribution and the second phase distribution is performed via a phase analysis algorithm.

10. The method of claim 7, wherein at least one of the sum of the first phase distribution and the second phase distribution, the difference between the first phase distribution and the third phase distribution, or the difference between the third phase distribution and the second phase distribution is performed optically.

11. The method of claim 7, wherein the calibrating a set of phase tilt data utilizing at least one of the second phase tilt or the third phase tilt comprises:
    calibrating a set of phase tilt data utilizing a statistical merging of the second phase tilt or the third phase tilt.

12. The method of claim 7, wherein the measurement of the first distribution from the first overlay target, the measurement of the second distribution from the second overlay target, and the measurement of the third distribution from the third overlay target are performed substantially simultaneously.

13. The method of claim 7, wherein the illumination reflected from the first overlay target, the illumination reflected from the second overlay target, and the illumination reflected from the third overlay target comprises at least one of narrow band illumination or broad band illumination.

14. A system for measuring overlay utilizing pupil phase information, comprising:
    a phase based metrology system configured to:
        measure a first phase distribution across a pupil plane of a portion of illumination reflected from a first overlay target of a semiconductor wafer, wherein the first overlay target is fabricated to have a first intentional overlay; and
        measure a second phase distribution across the pupil plane of a portion of illumination reflected from a second overlay target of the semiconductor wafer, wherein the second overlay target is fabricated to have a second intentional overlay, wherein the second intentional overlay is along a direction opposite to the first intentional overlay, wherein the first intentional overlay and the second intentional overlay have substantially the same magnitude; and
    one or more computer systems configured to:
        determine a first phase tilt associated with a sum of the first phase distribution and the second phase distribution;
        determine a second phase tilt associated with a difference between the first phase distribution and the second phase distribution; and
        calibrate a set of phase tilt data utilizing the determined second phase tilt; and
        determine a test overlay value associated with the first overlay target and the second overlay target utilizing by comparing the first phase tilt to the calibrated set of phase tilt data.

15. The system of claim 14, wherein the phase based metrology system is configured to measure a first distribution from the first overlay target and the second distribution from the second overlay target substantially simultaneously.

16. The system of claim 14, wherein the phase based metrology system is configured to optically sum the first phase distribution and the second phase distribution and optically subtract the second phase distribution from the first phase distribution.

17. The system of claim 14, wherein the illumination reflected from the first overlay target and the illumination reflected from the second overlay target comprises at least one of narrow band illumination or broad band illumination.

18. The system of claim 14, wherein the phase based metrology system includes one or more wave-front sensors.

19. The system of claim 14, wherein the phase based metrology system includes at least one of a spherical mirror or a holographic mirror.

20. The system of claim 14, wherein the phase based metrology system is configured as a two-beam interferometric optical system.

21. The system of claim 14, wherein the phase based metrology system is configured to measure at least one additional phase distribution across the pupil plane of a portion of illumination reflected from at least one additional overlay target of the semiconductor wafer.

22. The system of claim 14, wherein the pupil plane is divided into a plurality of symmetrical sections utilizing a spatially variable characteristic of the illumination reflected from the first overlay target or the second overlay target.

23. The system of claim 22, wherein the spatially variable characteristic comprises at least one of polarization or wavelength.

* * * * *